(12) United States Patent
Batude et al.

(10) Patent No.: US 9,343,375 B2
(45) Date of Patent: May 17, 2016

(54) METHOD FOR MANUFACTURING A TRANSISTOR IN WHICH THE STRAIN APPLIED TO THE CHANNEL IS INCREASED

(71) Applicant: Commissariat a L'Energie Atomique et aux Energies Alternatives, Paris (FR)

(72) Inventors: Perrine Batude, Dijon (FR); Frederic Mazen, Saint Egreve (FR); Shay Reboh, Sassenage (FR); Benoit Sklenard, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/802,283

(22) Filed: Jul. 17, 2015

(65) Prior Publication Data
US 2016/0020153 A1    Jan. 21, 2016

(30) Foreign Application Priority Data

Jul. 18, 2014 (FR) ...................................... 14 56936

(51) Int. Cl.
*H01L 21/8238* (2006.01)
*H01L 21/84* (2006.01)
*H01L 29/66* (2006.01)

(52) U.S. Cl.
CPC ........ *H01L 21/84* (2013.01); *H01L 21/823814* (2013.01); *H01L 29/66522* (2013.01); *H01L 29/66795* (2013.01)

(58) Field of Classification Search
CPC .............................................. H01L 21/823814
See application file for complete search history.

(56) References Cited

U.S. PATENT DOCUMENTS

| 2007/0045729 A1 | 3/2007 | Hoentschel et al. |
| 2008/0070370 A1 | 3/2008 | Wu et al. |
| 2010/0193882 A1 | 8/2010 | Hoentschel et al. |
| 2012/0068193 A1 | 3/2012 | Chan et al. |
| 2013/0137243 A1* | 5/2013 | Yang ................... H01L 29/6656 438/478 |

(Continued)

OTHER PUBLICATIONS

Q. Liu et al. "High Performance UTBB FDSOI Devices Featuring 20nm Gate Length for 14nm Node and Beyond", Electron Devices Meeting (IEDM), 2013 IEEE International, IEEE, 2013, 4 pages.

(Continued)

*Primary Examiner* — Daniel Shook
(74) *Attorney, Agent, or Firm* — Oblon, McClelland, Maier & Neustadt, L.L.P.

(57) ABSTRACT

Method of manufacturing a transistor on a layer made of a first crystalline semiconducting material to make a channel, deposited on a dielectric layer, the method including the following steps:
  epitaxial growth of zones made of a second semiconducting material on the layer made of a first crystalline semiconducting material, so as to form source and drain blocks with the layer made of a first crystalline semiconducting material on each side of the channel, the second semiconducting material having a lattice parameter different from that of the first semiconducting material,
  in-depth amorphization of part of zones made of a second semiconducting material so as to keep only one layer of second crystalline semiconducting material on the surface of the source and drain blocks, and amorphization of zones of the layer made of a first semiconducting material located under zones made of a second semiconducting material,
  recrystallization of the source and drain blocks such that the second semiconducting material imposes its lattice parameter on the source and drain zones.

19 Claims, 3 Drawing Sheets

(56) References Cited

U.S. PATENT DOCUMENTS

2014/0099763 A1  4/2014  Alptekin et al.
2015/0044828 A1* 2/2015  Batude .............. H01L 21/26513
                                                          438/166

OTHER PUBLICATIONS

T. Signamarcheix et al. "Fully Depleted Silicon on Insulator MOSFETs on (110) Surface for Hybrid Orientation Technologies", Solid-State Electronics, vol. 59, 2011, 5 pages.

T.W. Simpson et al. "Amorphization Threshold in Si-Implanted Strained SiGe Alloy Layers", Preprint to Appear in Microstructure of Irradiated Materials; Proceedings of Symposium Y, Fall 1994 Meeting of the Materials Research Society, Nov. 28-Dec. 2, 1994, 9 pages.
French Preliminary Search Report issued Mar. 5, 2015 in French Application 14 56936 filed on Jul. 18, 2014 (with English Translation of Categories of Cited Documents).

* cited by examiner

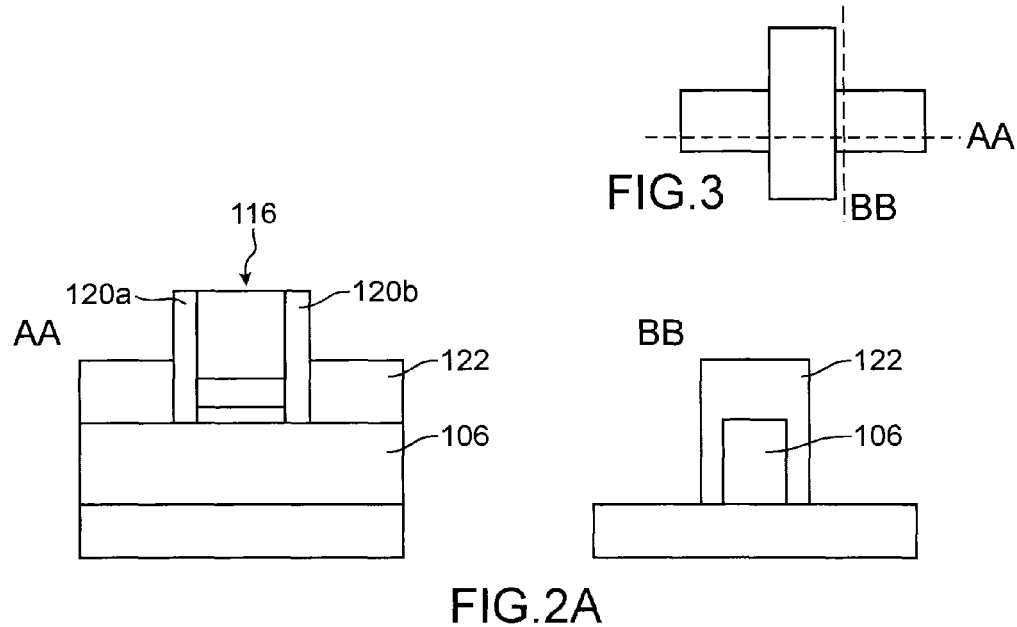
FIG. 3
FIG. 2A
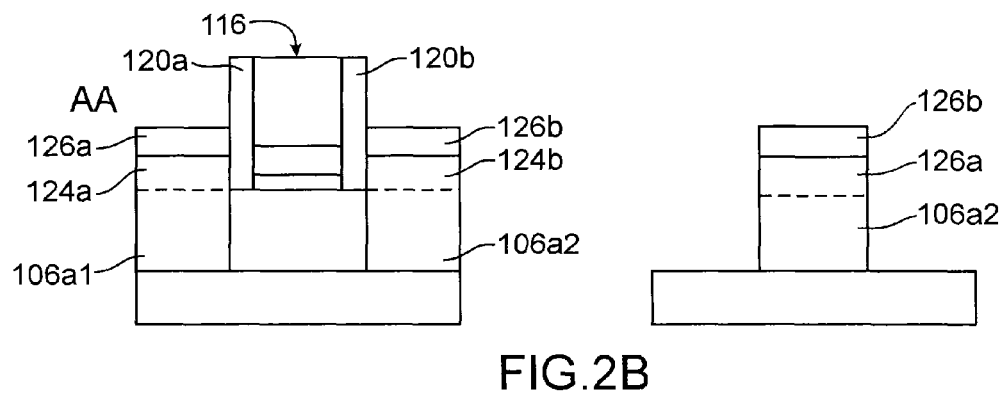
FIG. 2B
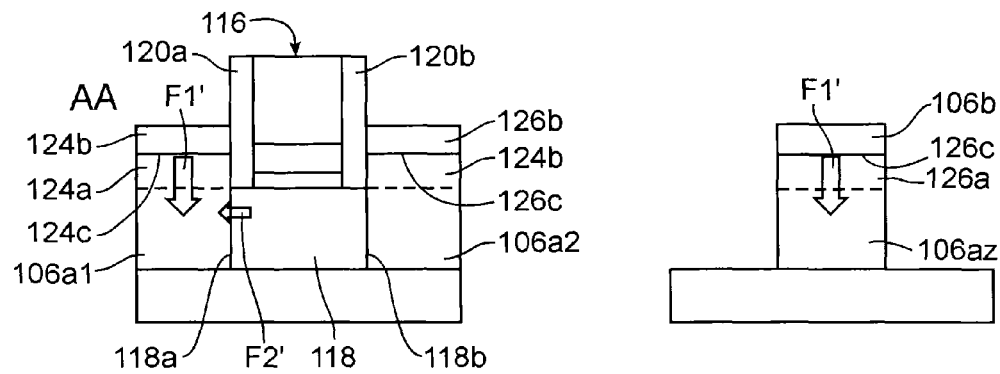
FIG. 2C

METHOD FOR MANUFACTURING A TRANSISTOR IN WHICH THE STRAIN APPLIED TO THE CHANNEL IS INCREASED

TECHNICAL DOMAIN AND STATE OF PRIOR ART

This invention relates to a method of manufacturing a transistor in the microelectronics field and more particularly a method in which the strain applied to the transistor channel is increased.

It is known that transistor performances can be improved by applying a strain to the semiconducting material forming the channel. A tensile strain is applied to an N type transistor, and a compressive strain is applied to a P type transistor.

This strain is generated by making the source and drain regions from a material with a lattice parameter smaller than the lattice parameter of the channel material to obtain a tensile strain, or a lattice parameter greater than the lattice parameter of the channel material to obtain a compressive strain. The material from which the source and drain regions are made is created by epitaxy on a layer in which the channel is formed.

Such a method is described for example in document "*IEDM* 2003 *p228 High Performance UTBB FDSOI Devices Featuring* 20 *nm gate Length for* 14 *nm Node and Beyond*" by Q. Liu and al.

For example for a silicon channel, an SiGe epitaxy can be used to apply a compressive strain in the channel and an SiC epitaxy can be used to apply a tensile strain. The added quantity of substitution carbon in the latter case is about 1%, which limits the tensile strain that can be applied.

PRESENTATION OF THE INVENTION

Consequently, one of the purposes of this invention is to disclose a method for manufacturing transistors capable of applying higher strains and particularly tensile strains than is possible with methods according to the state of the art.

The purpose mentioned above is achieved by a transistor manufacturing method comprising:
- a step in which zones that will partially form source and drain blocks are formed by epitaxy on the layer comprising the channel, from a material with a lattice parameter less than the lattice parameter of the channel material if a compressive strain is to be applied, and a material with a lattice parameter greater than the lattice parameter of the channel material if a tensile strain is to be applied,
- a partial amorphisation step of the source and drain to leave only a crystalline layer at the top of the access. The residual crystalline access layer is separated by an amorphous region from the channel zone that remained crystalline due to protection provided by the gate, and
- a recrystallisation step such that the crystalline residual access layer predominantly imposes its lattice parameter on the layer containing the channel.

With this invention, it is possible to make zones that will form SiGe source and drain blocks to apply a tensile strain to the silicon channel. It is then possible to apply strains higher than those obtained for example with an SiC epitaxy.

In other words, a crystalline germ is isolated in epitaxied zones that will form source and drain blocks, having a lattice parameter different from the lattice parameter of the channel zone; the germ can then relax and its own lattice parameter may be restored. A recrystallisation is then made under conditions such that the lattice parameter of the crystalline germ is predominant in the source and drain zones.

Very advantageously, N type transistors can be made using the method according to the invention and P type transistors can be made using the state of the art method, during a single SiGe epitaxy.

The transistor manufacturing method is then very much simplified because the protection required during the different steps while making one or the other epitaxy is no longer required.

Advantageously, the progress rate of the crystalline germ recrystallisation front is facilitated over the channel zone recrystallisation front by choosing a crystalline orientation favourable to the direction of the crystalline germ recrystallisation front. The addition of dopants into source and drain zones may also facilitate the progress rate of the crystalline germ recrystallisation front.

The subject-matter of the invention is then a method of manufacturing a transistor on a layer made of a first crystalline semiconducting material to make a channel, deposited on a dielectric layer, the method including the following steps:

a) growth of zones made of a second semiconducting material on the layer made of a first crystalline semiconducting material by at least one epitaxy, so as to form source and drain blocks with the layer made of a first crystalline semiconducting material on each side of the channel, the second semiconducting material having a lattice parameter different from that of the first semiconducting material;

b) in-depth amorphisation of part of zones made of a second semiconducting material so as to keep only one layer of the second crystalline semiconducting material on the surface of the source and drain blocks, and amorphisation of at least the zones of the layer made of a first semiconducting material located under zones made of a second semiconducting material;

c) recrystallisation of the source and drain blocks such that the second semiconducting material imposes its lattice parameter on the source and drain zones.

In one advantageous example, the crystalline orientation of the layer made of a first semiconducting material is <100>.

The method for making a transistor may comprise a step to make a gate on the layer made of a first semiconducting material and spacers between the gate and zones made of a second semiconducting material, during the amorphisation step of the zones made of the layer made of a first semiconducting material, the zones made of a first semiconducting material located under the spacers also being made amorphous.

A doping step may advantageously take place before, during or after the amorphisation step and before the recrystallisation step. The dopant(s) may be chosen from among phosphorus, arsenic, antimony and boron.

For example, the recrystallisation temperature of step c) is between 400° C. and 600° C.

The thickness of amorphous zones made of a second semiconducting material is preferably between 1 nm and 2 nm.

According to one example, the transistor made is an N type transistor and the second semiconducting material has a lattice parameter larger than the lattice parameter of the first semiconducting material. The first semiconducting material can then be Si and the second semiconducting material can be $Si_xGe_y$.

In one particularly advantageous embodiment, two epitaxy growth sub-steps take place during step a), a first growth sub-step during which a first portion of $Si_{x1}Ge_{y1}$ is formed, and a second sub-step during which a second portion of $Si_{x2}Ge_{y2}$ is formed, where y1 is greater than y2, and in which during step b), for a given dose and a given temperature, at least the zones of the silicon layer located under the $Si_{x1}Ge_{y1}$ zones are amorphised and y1 and y2 are chosen such that only the first portion of $Si_{x1}Ge_{y1}$ among the first $Si_{x1}Ge_{y1}$ and second $Si_{x2}Ge_{y2}$ portions is amorphised.

According to another example, the transistor made is a P type transistor in which the lattice parameter of the second semiconducting material is smaller than the lattice parameter of the first semiconducting material.

The first material and the second material may be III-V semiconducting materials, for example they may be made of InGaAs.

The layer made of a first semiconducting material and the layer made of a dielectric material may form part of an SOI substrate.

The transistor to be made may be an FDSOI, for example a FinFet.

Another subject-matter of the invention is a method of making several transistors separated by electrical isolating barriers in which the transistors are made using the method according to the invention, and in which the free face of the materials from which the electrical isolating barriers are made is lowered so as to reduce contact between the electrical isolating barriers and the zones made of a second semiconducting material.

Another subject-matter of the invention is a method of making a set of N type and P type transistors in which the N type transistors are made using the method according to the invention and in which the source and drain blocks are made directly during manufacturing of P type transistors by epitaxial growth of the second semiconducting material at the same time as the step for epitaxial growth of the second semiconducting material in the method for making N type transistors.

Another subject-matter of the invention is a method of making a set of N type and P type transistors in which the P type transistors are made using the method according to the invention and in which the source and drain blocks are made directly during manufacturing of N type transistors by epitaxial growth of the second semiconducting material at the same time as the step for epitaxial growth of the second semiconducting material in the method for making P type transistors.

BRIEF DESCRIPTION OF THE DRAWINGS

This invention will be better understood after reading the following description and appended drawings in which:

FIGS. 2A to 2C are diagrammatic views of steps in a method of making a FinFet according to one example embodiment of the invention, FIG. 3 is a top view of the Finfet in FIGS. 2A to 2C.

DETAILED PRESENTATION OF PARTICULAR EMBODIMENTS

We will describe a method of making transistors in which it is required to apply a tensile strain to the channel in order to make an N type transistor.

Figure 1A:
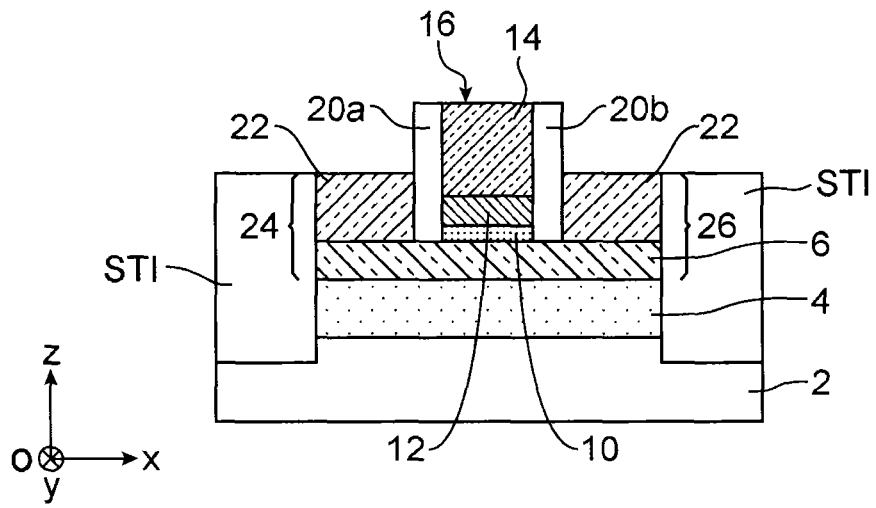
FIGS. 1A to 1D are diagrammatic views of steps in a method according to one example embodiment of the invention.

FIG. 1A shows an example of a transistor.

The transistor comprises a substrate 2 on which a layer of dielectric material is formed, for example made of oxide 4, this may be for example BOX (BOX for "Buried OXide"), with a thickness for example of the order of 20 nm.

A layer made of a semiconducting material 6 based on crystalline material, silicon in the example described, is formed on the dielectric layer 4 and is in contact with it. The thickness of the semiconducting layer 6 may for example be between 3 nm and 50 nm, for example of the order of 6 nm.

The substrate 2, the oxide layer 4 and the Si 6 layer may form an SOI type substrate (Silicon on Insulator).

A gate 8 is formed on the layer 6. This is done by performing steps to deposit a gate dielectric layer 10, for example an oxide layer, and one or several layers 12, 14 of gate material(s), and then etching these layers in order to make a gate pattern 16 facing a zone 18 on the semiconducting layer 6 that will form a channel for the transistor. The transistor gate 16 may comprised a stack comprising a metal layer 12, for example based on TiN, on which a semiconducting layer 14 is supported, for example based on polysilicon.

Insulating spacers 20a, 20b, for example based on $Si_xN_y$, are also formed in contact with the side flanks of the gate 16, and are supported on the semiconducting layer 6.

The crystalline semiconducting material 22 is then made to grow by epitaxy on the semiconducting layer 6, to form crystalline semiconducting blocks 24, 26 with this semiconducting layer 6, these blocks being designed to form raised source and drain regions based on crystalline semiconducting material and arranged on each side of the zone 18 of the channel and the spacers 20a, 20b. The thickness of the semiconducting material 22 that is made to grow may for example be of the order of 16 nm.

<<Raised>> means that the blocks 24, 26 that, like the channel zone 18, are supported on the insulating layer 4, extend above the semiconducting layer 6 and thus their thickness is greater than the thickness of the channel zone 18. The thickness E (measured along the direction of the z-axis of the orthogonal coordinate system [O,x,y,z]) of blocks 24, 26 may for example be of the order of 21 nm (FIG. 1A).

In this example, the semiconducting material 22 is SiGe for which the lattice parameter is larger than the lattice parameter of silicon. For reasons of simplicity, $Si_wGe_z$ will be denoted SiGe in the remainder of this application. For example, the SiGe contains about 30% Ge.

During epitaxial growth, the SiGe grows as a function of the lattice parameter of silicon and thus applies a compressive strain on the channel zone 18.

The next step is to apply an in-depth or partially buried amorphisation step to regions 24, 26 so as to form in-depth zones 24a, 26a of amorphous material starting from regions 24 and 26 and regions 6a1, 6a2 of amorphous material in the layer 6, so as to keep a layer of crystalline material 24b, 26b at the free upper part of the regions 24, 26 or at the top of the access. These residual layers of crystalline material form a crystalline germ for subsequent recrystallisation.

Buried amorphisation may for example be made based on conditions like those described in the document by Signamarcheix T. and al., <<*Fully depleted silicon on insulator MOSFETs on* (110) *surface for hybrid orientation technologies*>> *Solid-State Electronics* Volume 59, Issue 1, May 2011. In this document, amorphisation is achieved by the implantation of Si ions at high dose and high energy.

The channel zone 18 and the layers 24b, 26b are crystalline at the end of this amorphisation step.

When the partial amorphisation step is complete, the SiGe crystalline layers 24b, 26b are isolated from the Si channel region, i.e. they are separated from it by an amorphous zone. The crystalline layers 24b, 26b can then relax and the SiGe's own lattice parameter is restored. This relaxation is advantageously facilitated by the raised position of the blocks 24, 26, and particularly the access zones. It may be envisaged to heat the assembly to facilitate relaxation of the crystalline layers 24b, 26b.

Figure 1B:
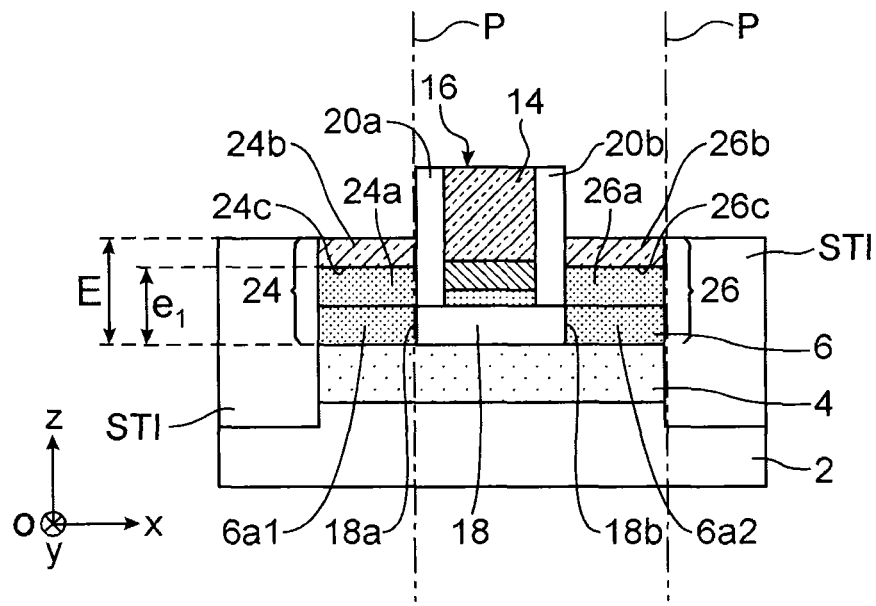

In the example shown in FIG. 1B, the channel zone 18 extends over the entire width of the gate and under spacers, and the amorphous zones 6a1, 6a2 are in contact with the two side faces of the channel zone 18 at the vertical planes P containing the side flanks of the spacers that are facing the side flanks in contact with the gate. As a variant, we will see that it would be possible to envisage amorphisation under the spacers.

The element thus achieved is shown in FIG. 1B.

As a variant, it might be possible to complete the amorphisation using at least one implantation step. The amorphising implantation of semiconducting material in semiconducting regions may be done using a doping species that acts as an electron donor in order to also make an N type doping, or using a doping species that acts as an electron acceptor to make a P type doping.

This implantation may also be done so as to dope parts of the semiconducting regions located under spacers, on each side of the channel zone 18.

Thus, the channel access regions are doped at the same time as they are made amorphous.

This can be done by performing an implantation by means of an inclined beam forming a non-zero angle, or even a zero angle, relative to a normal to the main plane of the substrate (the main plane of the substrate being a plane defined by a plane passing through the substrate and parallel to the [O,x,y] plane).

Implantation with a dose for example equal to $5 \times 10^{13}$ and $4 \times 10^{15}$, and an angle for example between 0° and 60°, provides a means of reaching and doping regions located under the spacers close to the channel zone 18.

At the end of the amorphisation step, the zones made amorphous extend in a vertical direction from the top face of the insulating layer 4 as far as a given height equal to $e_1$ that is less than the thickness E of the semiconducting blocks 24, 26. Zones 24a, 26a are surmounted by and are in contact with the layers 24b, 26b of crystalline semiconducting material belonging to the semiconducting blocks 24, 26 and for which the crystalline structure was not impacted by the amorphisation step.

During a subsequent step, recrystallisation of the amorphous zones is made for example by annealing. Two recrystallisation fronts appear in each source and drain region during this recrystallisation step shown diagrammatically in FIG. 1C:
one recrystallisation front 24c from layer 24b and one recrystallisation front 18a from a flank of the channel zone 18;
one recrystallisation front 26c from the layer 26b and one recrystallisation front 18b from the other flank of the channel zone 18.

Recrystallisation is initiated by applying a given temperature to the element. This temperature may for example be between 400° C. and 600° C. but recrystallisation could take place at higher temperatures.

Figure 1C:
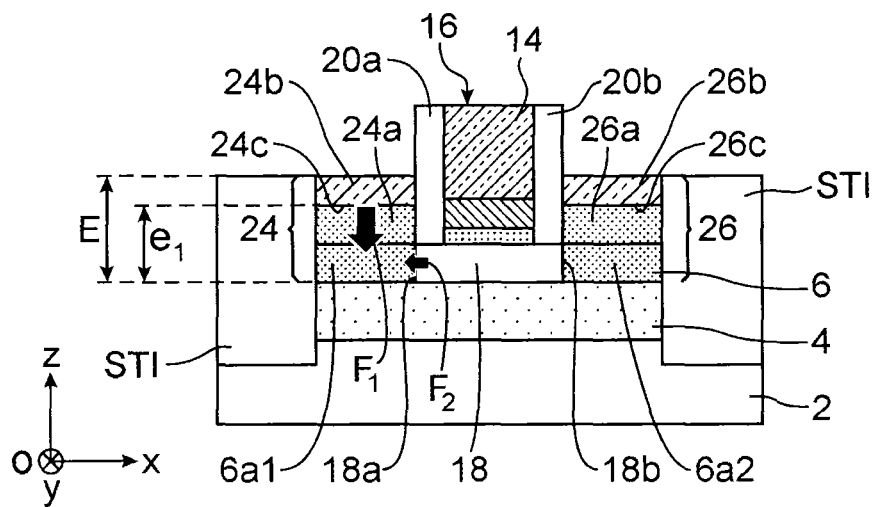

In the view shown in FIG. 1C, the front 24c, for which the displacement is symbolised by arrow F1, progresses vertically downwards and the front 18a of the channel zone 18, for which the displacement is symbolised by arrow F2, progresses laterally towards the left; the front 26c progresses vertically downwards and the other front 18b of the channel zone 18 progresses laterally towards the right.

Recrystallisation conditions are such that the SiGe imposes the lattice parameter of SiGe on the Si located below the zones 24a, 26a, a tensile strain is then applied to the silicon in channel 18.

Figure 1D:
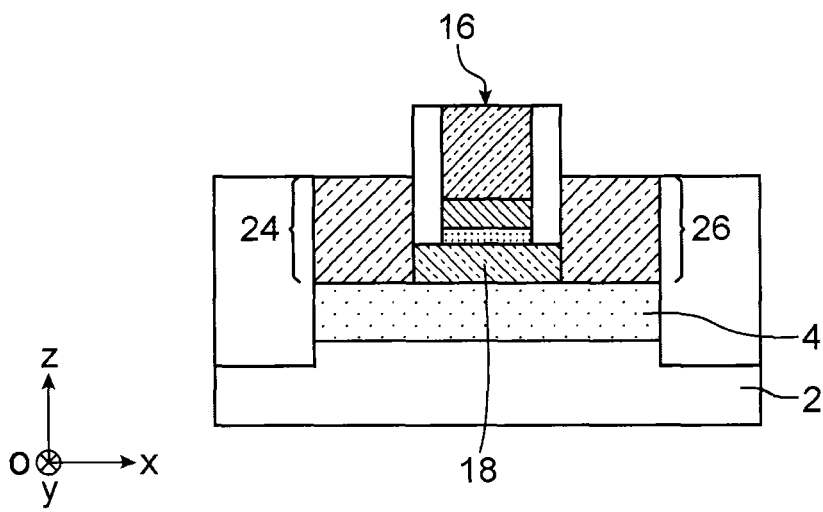

The element thus achieved is shown in FIG. 1D.

To achieve this, the recrystallisation fronts 24c, 26c are preferably as close as possible to channel 18 before intersecting fronts 18a, 18b.

Preferably, during the amorphisation step, the amorphous layers 24a, 26a are very thin such that recrystallisation fronts 24c, 26c are close to the amorphous silicon zones 6a1, 6a2. This thus reduces the distance to be traveled by the fronts 24c, 26c to begin to recrystallise the silicon.

For example, in the case of zones 24, 26 with a thickness after epitaxy of 15 nm on a 6 nm silicon layer 6 that corresponds to the thickness of the channel 18, a 13 nm thick crystalline layer 24b, 26b is kept, and 2 nm thick amorphous zones 24a, 26a and 6 nm thick amorphous zones in the layer 6 are formed facing accesses on each side of the channel zone.

Preferably, the total amorphous thickness is between 8 nm and 18 nm.

Preferably, the amorphous layer 24a, 26a is as thin as possible and for example between 1 nm and 2 nm.

Also preferably, the layer 6 of the channel is thin, which slows progression of the recrystallisation fronts de 18a, 18b.

Very advantageously, the choice of the crystallographic orientation of the crystalline layers makes it possible to prefer one crystallisation direction over another.

The orientations of the channel 18 and the crystalline zones 24b, 26b are identical because layers 24b, 26b are derived from epitaxial growth on the layer 6 in which the channel 18 is formed.

In choosing the <110> orientation of the channel 18, the ratio between the effective recrystallisation rate in the vertical direction and the effective recrystallisation rate in the horizontal direction is more than 2. The recrystallisation rate in the horizontal direction is composed of the recrystallisation rate along the <110> direction that is less than the rate along the <100> direction by an order of two and a recrystallisation rate along the <111> direction that is less than the rate along the <100> direction by an order of 10.

Thus, the recrystallisation fronts 24c, 26c progress at least twice as fast as the fronts 18a, 18b.

As a variant, it might be possible to amorphise at least part of the zone located under spacers, unlike the amorphisation shown in FIG. 1B. For example, this amorphisation can be done by means of an inclined beam. In this case, during recrystallisation, the recrystallisation fronts of the channel zone have an interface with the oxide layer 10 and an interface with the material of the spacers 20a and 20b, the recrystallisation under the spacers is then of the <111> type while recrystallisation of the SiGe front is still of the <100> type. The ratio of the rates is then of the order of 20 in the intrinsic silicon zones, the vertical recrystallisation front of Si progressing 20 times faster than the recrystallisation front of Si.

The recrystallisation rate in SiGe at the interface 24c depends on the Ge concentration.

Furthermore, the choice of the material for the source and drain zones can be such that rates of fronts 24c, 26c are greater than rates of fronts 18a, 18b. For example, SiGe has a recrystallisation rate about eight times higher than the recrystallisation rate of Si along the <100> direction at 550° C. for a Ge concentration of the order of 30%.

The recrystallisation rates can also be modulated by doping. The choice of the dopant type and/or the choice of the dopant concentration and/or the choice of the recrystallisation temperature can accelerate or otherwise slow the recrystallisation rate.

For example, phosphorus, As, Sb, Boron, can be used to dope zones to be recrystallised. The dopant concentration to be added depends on the temperature at which recrystallisation is performed. The recrystallisation rate drops beyond a given concentration of dopants. This concentration limit depends on the type of dopant and the temperature. Aluminium, Gallium, indium and Bismuth may be used as dopants, however their solubility in silicon is lower.

Doping can be done during epitaxial growth of regions 24 and 26 by adding gas containing the dopant to the gas mix used for epitaxy, and it is activated during the epitaxy and/or during the amorphisation step as described above, the dopants being activated during recrystallisation and/or after amorphisation.

The recrystallisation rates of fronts can be modelled using software, for example the Sentaurus Process software marketed by Synopsys; parameters (prefactors and activation energy in an Arrhenius's law) for each microscopic configuration on a {100}, {110} or {111} plane are input into the software to determine recrystallisation rates. Thus, the change in the two recrystallisation fronts can be determined and values of the different parameters can be chosen such that SiGe or any other appropriate material imposes its lattice parameter.

Furthermore, adjacent transistors are separated by an electrical isolating barrier to prevent a short circuit between transistors. This barrier is referred to as an STI for "Shallow Trench Isolation". STIs are shown in FIG. 1A.

When the material used for the STIs is tensile relative to the material of the source and drain zones 24, 26, this helps relaxation of the material of the source and drain regions deposited by epitaxy.

But, if the material used for the STI(s) is compressive relative to the material of the source and drain regions, it is preferable to reduce or even eliminate contact between the STI(s) and the source and drain regions. The level of the top face of the STI(s) may be lowered for this purpose.

In a particularly advantageous embodiment, the Ge concentration varies during growth of SiGe on the semiconducting layer 6, so that the amorphised zone of SiGe and therefore the interface between the amorphised zone and the crystalline zone can be positioned very precisely.

To achieve this, when SiGe portions are made on the Si, a first layer is formed from $Si_{x1}Ge_{y1}$ by epitaxy and a second layer is formed from $Si_{x2}Ge_{y2}$ by epitaxy, y1 being greater than y2. The difference in Ge concentration between the two layers is chosen such that during amorphisation with a given dose and given temperature, apart from amorphisation of Si zones located under the SiGe, only the $Si_{x1}Ge_{y1}$ layer "rich in Ge" is amorphised in the SiGe portions. The $Si_{x2}Ge_{y2}$ layer corresponds to the zone left crystalline 24b, 26b and the $Si_{x1}Ge_{y1}$ layer corresponds to the amorphous zone 24a, 26a. It is therefore possible to do a selective amorphisation by choosing y1, y2, the dose and the temperature. Thus, the interface between the amorphised zone and the zone that remained crystalline is defined by the concentration of Ge and corresponds to the interface between the two layers. This interface is then positioned very precisely and its roughness may be lower.

This selectivity in amorphisation is described for example in the document <<*Amorphization threshold in Si implanted strained SiGe alloy layers*" T. W. Simpson and al. *EMRS* November 94, Boston.

For example, the difference between the Ge concentration in the lower zone and the upper zone is 5%.

Those skilled in the art will know how to obtain the experimental curves to determine the difference in Ge concentration as a function of the value of the dose and the temperature to achieve a selective amorphisation.

This invention is particularly suitable for Fully-Depleted Silicon on Insulator (FDSOI) transistors, because they include raised source and drain regions. They also use an SOI substrate, the channel and the source and drain regions then being made on a BOX layer which is also conducive to recrystallisation according to the SiGe lattice parameter that is predominant relative to MOS transistors using a bulk substrate.

The method according to this invention is also applicable to FinFET (Fin-Shaped Field Effect Transistor) transistors. One example of such a method is shown in FIGS. 2A to 2C. FIG. 63 shows a top view of the FinFet. FIGS. 2A to 2C show views along section planes AA and BB shown diagrammatically in FIG. 3.

The references used in FIGS. 1A to 1C plus 100 are used to denote the same elements. For example, the layer in which the channel zone is formed is denoted 106 and the gate pattern is denoted 116.

In FIG. 2A, the crystalline semiconducting material 122 is grown by epitaxy on the semiconducting layer 106, in order to form crystalline semiconducting blocks 124, 126 with this semiconducting layer 106, 110, that will form source and drain regions based on crystalline semiconducting material and located on each side of the channel zone 118 and the spacers 120a, 120b.

In this example, the semiconducting material 122 is SiGe that has a lattice parameter larger than the lattice parameter of silicon.

During epitaxial growth, SiGe grows according to the silicon lattice parameter and then applies a compressive strain on the channel zone 118.

In FIG. 2B, an in-depth amorphisation step is applied to regions 124, 126 so as to form in-depth zones 124a, 126a of amorphous material starting from regions 124 and 126 and regions 106a1, 106a2 of amorphous material in layer 106 so as to keep a layer of crystalline material 124b, 126b at the free upper part of regions 124, 126 or at the top of the access. These residual layers of crystalline material form a crystalline germ for subsequent recrystallisation.

The channel zone 118 and layers 124b, 126b are crystalline at the end of this amorphisation step.

During a next step shown in FIG. 2C, the amorphous zones are recrystallised for example by annealing. Two recrystallisation fronts diagrammatically shown by arrows appear in each source and drain region during this recrystallisation step.
  a recrystallisation front 124c starting from the layer 124b and a recrystallisation front 118a starting from a flank of the channel zone 118;
  a recrystallisation front 126c starting from the layer 126b and a recrystallisation front 118b starting from the other flank of the channel zone 118.

In the view shown in FIG. 2C, the front 124c, the displacement of which is represented by arrow F1', progresses vertically downwards and the front 118a of the channel zone 118, for which the displacement is represented by arrow F2', progresses laterally towards the left, the front 126c progresses vertically downwards and the other front 118b of the channel zone 118 progresses laterally towards the right.

Recrystallisation conditions are such that SiGe imposes the SiGe lattice parameter on the Si located below zones 124a, 126a, and a tensile strain is then applied to the silicon in channel 18.

This invention is also advantageous to strain a transistor channel made of an III-V material. For example, in the case of a transistor on insulator with an InGaAs channel, it is possible to make an epitaxy with a higher indium concentration in the epitaxy to give a compressive strain and to use the method according to the invention (amorphisation and recrystallisation) to create the tensile strain in the NMOS, and vice versa.

Other materials can be chosen for the channel and for the source and drain zones.

For the case of a germanium or SiGe channel, source and drain zones are made by SiGe epitaxy with a Ge concentration lower than in the channel, to apply the tensile strain. As a variant, epitaxy may be performed using GeSn to apply a compressive strain.

With the invention, a material can be chosen for which epitaxy is easiest, and as a function of the compressive or tensile strain introduced during epitaxy, the amorphisation and recrystallisation steps take place on the NMOS or the PMOS to apply the other tensile or compressive strain.

The invention simplifies simultaneous production of N type or P type transistors. It is advantageously possible to perform an SiGe epitaxy and more generally a compressive material epitaxy to apply a compressive strain to make P type transistors at the same time as a tensile strain to make N type transistors. All that is necessary to apply a compressive strain to the channel is an SiGe epitaxy in the case of an Si channel, and the method according to the invention is used to apply a tensile strain to the channel. It is then no longer necessary to protect N zones during epitaxy on P zones and vice versa, this protection usually being made by deposition of a nitride film that subsequently has to be removed. An epitaxy of a single tensile material can also be used to apply a tensile strain to make P type transistors and to apply a compressive strain to make N type transistors.

Therefore, the production method for CMOSs is simplified.

Nevertheless, a method for making CMOSs using two different epitaxies for N zones and P zones is not outside the scope of this invention. For example, it would be possible to use the method according to the invention to apply a tensile strain for example from an SiGe epitaxy and to use the method according to the invention to apply a compressive strain for example from an SiC epitaxy.

The invention claimed is:

1. Method of manufacturing a transistor on a layer made of a first crystalline semiconducting material to make a channel, deposited on a dielectric layer, the method including the following steps:
   a) growing zones made of a second semiconducting material on the layer made of a first crystalline semiconducting material by at least one epitaxy, so as to form source and drain blocks with the layer made of a first crystalline semiconducting material on each side of the channel, the second semiconducting material having a lattice parameter different from that of the first semiconducting material,
   b) in-depth amorphisation of part of zones made of a second semiconducting material so as to keep only one layer of the second crystalline semiconducting material on the surface of the source and drain blocks, and amorphisation of at least the zones of the layer made of a first semiconducting material located under zones made of a second semiconducting material,
   c) recrystallisation of the source and drain blocks such that the second semiconducting material imposes its lattice parameter on the source and drain zones.

2. Method of manufacturing a transistor according to claim 1, in which the crystalline orientation of the layer made of a first semiconducting material is <100>.

3. Method of manufacturing a transistor according to claim 2, comprising a step to make a gate on the layer made of a first semiconducting material and spacers between the gate and zones made of a second semiconducting material, in which during the amorphisation step of the zones made of the layer made of a first semiconducting material, the zones made of a first semiconducting material located under the spacers are also made amorphous.

4. Method of manufacturing a transistor according to claim 1, in which a doping step takes place before, during or after the amorphisation step and before the recrystallisation step.

5. Method of manufacturing a transistor according to claim 4, in which the dopant(s) is (are) chosen from among phosphorus, arsenic, antimony and boron.

6. Method of manufacturing a transistor according to claim 1, in which the recrystallisation temperature is between 400° C. and 600° C.

7. Method of manufacturing a transistor according to claim 1, in which the thickness of amorphous zones made of a second semiconducting material is between 1 nm and 2 nm.

8. Method of manufacturing a transistor according to claim 1, in which the transistor made is an N type transistor and the second semiconducting material has a lattice parameter larger than the lattice parameter of the first semiconducting material.

9. Method of manufacturing a transistor according to claim 8, in which the first semiconducting material is Si and the second semiconducting material is $Si_xGe_y$.

10. Method of manufacturing a transistor according to claim 9, in which two epitaxy growth sub-steps take place during step a), a first growth sub-step during which a first portion of $Si_{x1}Ge_{y1}$ is formed, and a second sub-step during which a second portion of $Si_{x2}Ge_{y2}$ is formed, where y1 is greater than y2, and in which during step b), for a given dose and a given temperature, at least the zones of the silicon layer located under the $Si_{x1}Ge_{y1}$ zones are amorphised and y1 and y2 are chosen such that only the first portion of $Si_{x1}Ge_{y1}$ among the first $Si_{x1}Ge_{y1}$ and second $Si_{x2}Ge_{y2}$ portions is amorphised.

11. Method of manufacturing a set of N type and P type transistors in which the N type transistors are made using the method according to claim 8, and in which the source and drain blocks are made directly during manufacturing of P type transistors by epitaxial growth of the second semiconducting material at the same time as the step for epitaxial growth of the second semiconducting material in the method for making N type transistors.

12. Method of manufacturing a transistor according to claim 1, in which the transistor made is a P type transistor in which the lattice parameter of the second semiconducting material is smaller than the lattice parameter of the first semiconducting material.

13. Method of making a set of N type and P type transistors in which the P type transistors are made using the method according to claim 12, and in which the source and drain blocks are made directly during manufacturing of N type transistors by epitaxial growth of the second semiconducting material at the same time as the step for epitaxial growth of the second semiconducting material in the method for making P type transistors.

14. Method of manufacturing a transistor according to claim 12, in which the first material and the second material are III-V semiconducting materials.

15. Method of manufacturing a transistor according to claim 1, in which the first material and the second material are III-V semiconducting materials.

16. Method of manufacturing a transistor according to claim 1, in which the layer made of a first semiconducting material and the layer made of a dielectric material form part of an SOI substrate.

17. Method of manufacturing a transistor according to claim 1, in which le transistor to be made is an FDSOI.

18. Method of manufacturing a transistor according to claim 1, in which le transistor to be made is an FinFet.

19. Method of manufacturing several transistors separated by electrical isolating barriers in which the transistors are made using the method according to claim 1, and in which the free face of the materials from which the electrical isolating barriers are made is lowered so as to reduce contact between the electrical isolating barriers and the zones made of a second semiconducting material.

* * * * *